(12) United States Patent
Hasegawa

(10) Patent No.: US 6,624,008 B2
(45) Date of Patent: Sep. 23, 2003

(54) SEMICONDUCTOR CHIP INSTALLING TAPE, SEMICONDUCTOR DEVICE AND A METHOD FOR FABRICATING THEREOF

(75) Inventor: Kiyoshi Hasegawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/499,455

(22) Filed: Feb. 7, 2000

(65) Prior Publication Data

US 2002/0052104 A1 May 2, 2002

(30) Foreign Application Priority Data

Jul. 7, 1999 (JP) ............................................ 11-192753

(51) Int. Cl.[7] ........................ H01L 21/44; H01L 23/495
(52) U.S. Cl. ........................ 438/125; 438/126; 257/668
(58) Field of Search .................. 438/106, 110, 438/111, 112, 125, 126, 127, 613, 612; 257/668, 671, 678, 734, 737, 774, 784, 787; 174/250, 260, 263, 265, 268

(56) References Cited

U.S. PATENT DOCUMENTS 4,530,896 A * 7/1985 Christensen et al. ........ 430/155
4,945,634 A * 8/1990 Kumada ...................... 29/854
4,977,441 A * 12/1990 Ohtani et al. ................ 357/70
5,684,328 A * 11/1997 Jin et al. ..................... 257/669
5,696,032 A * 12/1997 Phelps et al. ................ 437/209
5,990,545 A * 11/1999 Schueller et al. ........... 257/697
6,199,273 B1 * 3/2001 Kubo et al. .................. 29/843
6,258,632 B1 * 7/2001 Takebe ........................ 438/127

FOREIGN PATENT DOCUMENTS

JP          64-72537          3/1989
JP          5-315405          11/1993

* cited by examiner

Primary Examiner—Kamand Cuneo
Assistant Examiner—Scott B Geyer
(74) Attorney, Agent, or Firm—Venable LLP; Norman N. Kunitz

(57) ABSTRACT

A semiconductor chip mounting tape on which external connecting terminals are formed in accordance with a layout pattern has post portions which are to be connected to a semiconductor chip and external connecting terminals. Post portions are formed on the first surface of an insulation tape used as a base of the semiconductor chip mounting tape. External connecting terminals are formed on the second surface of the insulation tape. The post portions and the external connecting terminals are integrally formed by same solder balls via through holes formed in the insulation tape.

5 Claims, 4 Drawing Sheets

11 INSULATION TAPE  
12 EXTERNAL CONNECTING TERMINAL

13 POST PORTION

SEMICONDUCTOR CHIP INSTALLING TAPE, SEMICONDUCTOR DEVICE AND A METHOD FOR FABRICATING THEREOF

BACKGROUND OF THE INVENTION

1. Field of the Invention

The invention relates to a semiconductor chip package such as a ball (or bump) grid array (BGA) package, particularly a semiconductor chip mounting tape, and also to a semiconductor device, and fabricating methods.

2. Description of Related Art

In BGA packages, circuit patterns are formed on both sides of a substrate (or a tape) and a semiconductor chip is mounted on the surface of the substrate.

For the electrical connection of the semiconductor chip mounted on the substrate, pads formed on the semiconductor chip and leads formed on the surface of the substrate are electrically connected by wire bonds (or bumps in the case of a flip chip system) and a connecting portion is protected by a resin seal formed by a method such as molding, potting, or the like.

Solder balls serving as external connecting terminals are formed on the circuit pattern on the back side of the substrate in accordance with a predetermined layout pattern.

The solder ball is temporarily fixed to a predetermined position by a ball mounter by using a flux, thereafter, reflowed through a furnace, and fixedly bonded onto the substrate, thereby forming the external connecting terminal.

With regard to the external connecting terminals, the diameter of the ball is reduced due to demands for miniaturization of the package and use of multi-pins, and the adoption of a narrower pitch of terminals is also occurring.

FIG. 1 is a cross sectional view showing a state where a solder balls are held by vacuum at a vacuum plate of the conventional ball mounter. The mounting of solder balls 1 by the ball mounter is performed by using the vacuum plate 2.

Vacuum holes 4 having tapered portions 3 are formed in the vacuum plate 2 in accordance with the layout pattern of the pads on the back side of the substrate, thereby holding the solder balls 1 by vacuum evacuating by an apparatus (not shown).

The solder balls 1 are subsequently deposited on the substrate by a method whereby a flux 5 is transferred to the solder balls 1 and the solder balls 1 are temporarily fixed onto the pads of the substrate by an adhering force of the flux 5.

However, a problem occurs in that the diameter of the solder ball 1 decreases and the flux 5 transferred to the solder ball 1 is deposited to the tapered portion 3 of the vacuum plate 2. As a result, separation of the solder balls 1 from the vacuum plate 2 is disturbed or hindered by the flux, and the solder ball 1 cannot be deposited surely onto the pad of the substrate.

When, on the other hand, the solder balls 1 have a reduced diameter, the transfer amount of the flux to the solder ball 1 decreases, so that fouling such as an oxide film on the pad of the substrate cannot be sufficiently removed by the flux. This will result in degrading of the fusing state of the solder at the time of the reflow process. Thus, there also is a problem that the solder ball 1 drops because the solder is insufficiently fused.

OBJECTS AND SUMMARY OF THE INVENTION

To solve the above problems, according to the invention, post portions to be connected to semiconductor chips are formed on a first surface of a tape having an insulation characteristic, which will be referred to as insulation tape, external connecting terminals are formed on a second surface of the insulation tape, and the post portions and the external connecting terminals are integrally formed by solder balls piercing through holes formed in the insulation tape.

BRIEF DESCRIPTION OF THE DRAWINGS

FIGS. 2 and 3 are diagrams showing a semiconductor chip mounting tape according to the invention, in which FIG. 2 is a plan view and FIG. 3 is a cross sectional view;

DETAILED DESCRIPTION OF THE PREFERRED EMBODIMENTS

Figure 2:
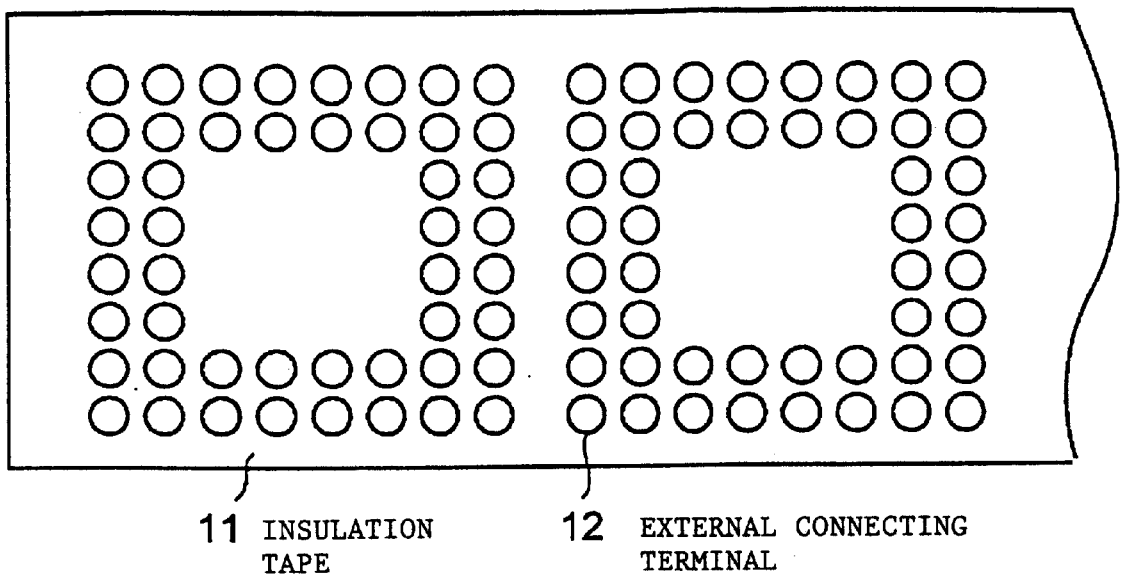
Figure 3:
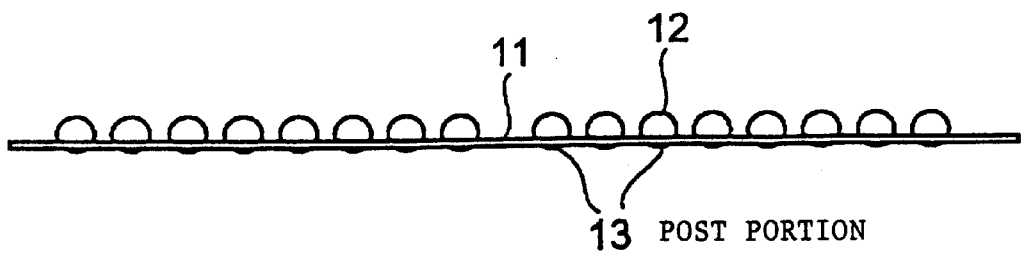

FIGS. 2 and 3 are diagrams showing a semiconductor chip mounting tape according to the invention. FIG. 2 is a plan view and FIG. 3 is a cross sectional view. These diagrams are shown in a state where the back side of the semiconductor chip mounting tape faces upward.

A plurality of external connecting terminals 12 are arranged on the back side (second surface) of a film-like insulation tape 11 made of for example, polyimide, in accordance with a layout pattern which has been predetermined for a plurality of semiconductor chips.

A plurality of post portions 13 to be electrically connected to bonding pads formed on the semiconductor chips by wire bonds are formed on the surface (first surface) of the insulation tape 11.

The external connecting terminal 12 and post portion 13 are integrally formed by the same solder ball via a through hole formed in the insulation tape 11.

Figure 4:
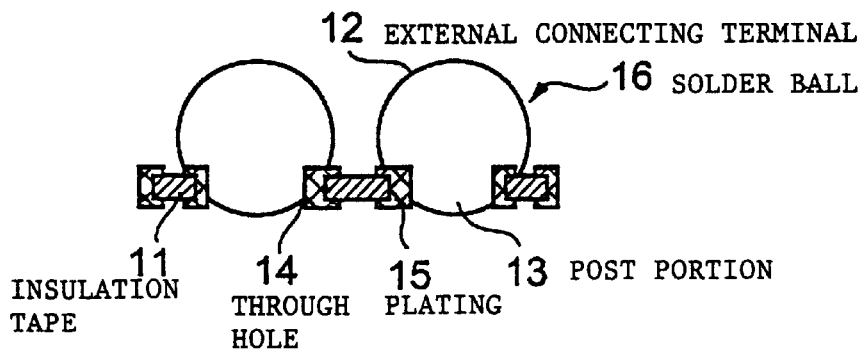
FIG. 4 is an enlarged cross sectional view of a part of the semiconductor chip mounting tape shown in FIGS. 2 and 3.

FIG. 4 is an enlarged cross sectional view of a part of the semiconductor chip mounting tape shown in FIGS. 2 and 3. The diagram is shown in a state where the second surface of the insulation tape 11 faces upward.

Through holes 14 are formed in the insulation tape 11 and plating 15 is performed to opening portions of the through holes, namely, wall portions of the through holes 14 and hole peripheral portions on both sides of the insulation tape 11.

The external connecting terminals 12 are formed on the second surface of the insulation tape 11 and the post portions 13 are formed on the first surface in a manner such that the external connecting terminals 12 and the post portions 13 are integrally formed by the same solder balls 16 exposed to both sides of the insulation tape 11 via the through holes 14.

The solder ball 16 is fixed to the insulation tape 11 through the plating 15 by ref lowing.

According to the semiconductor chip mounting tape by the invention as mentioned above, since the solder balls 16 are embedded into the through holes 14 and the external connecting terminals 12 and post portions 13 are formed, the external connecting terminals 12 can be positively formed on the insulation tape 11.

Figure 5:
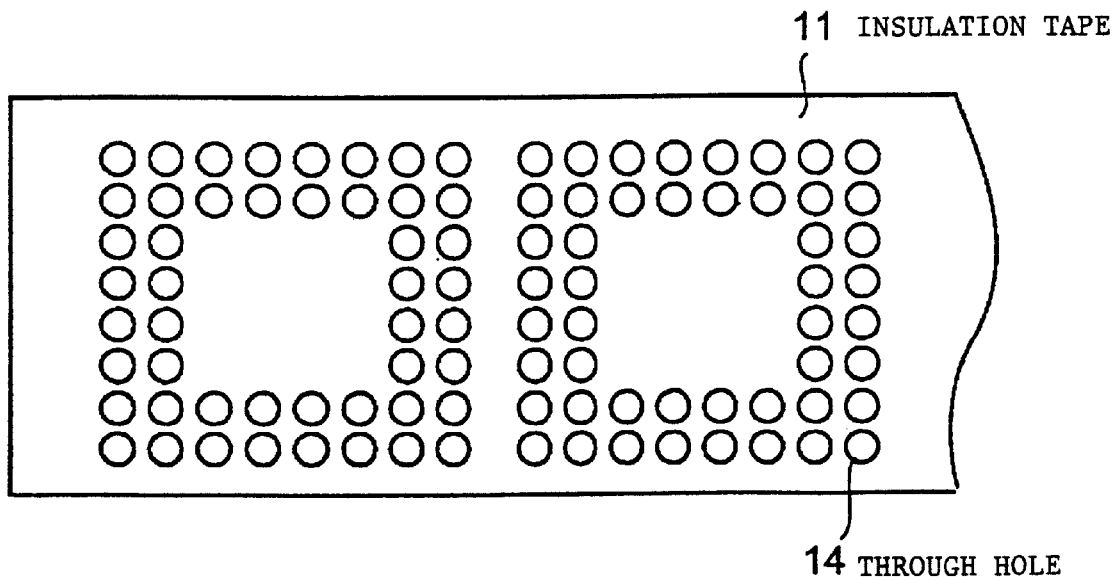
FIG. 5 is a plan view showing a state where through holes are formed in an insulation tape.
Figure 6:
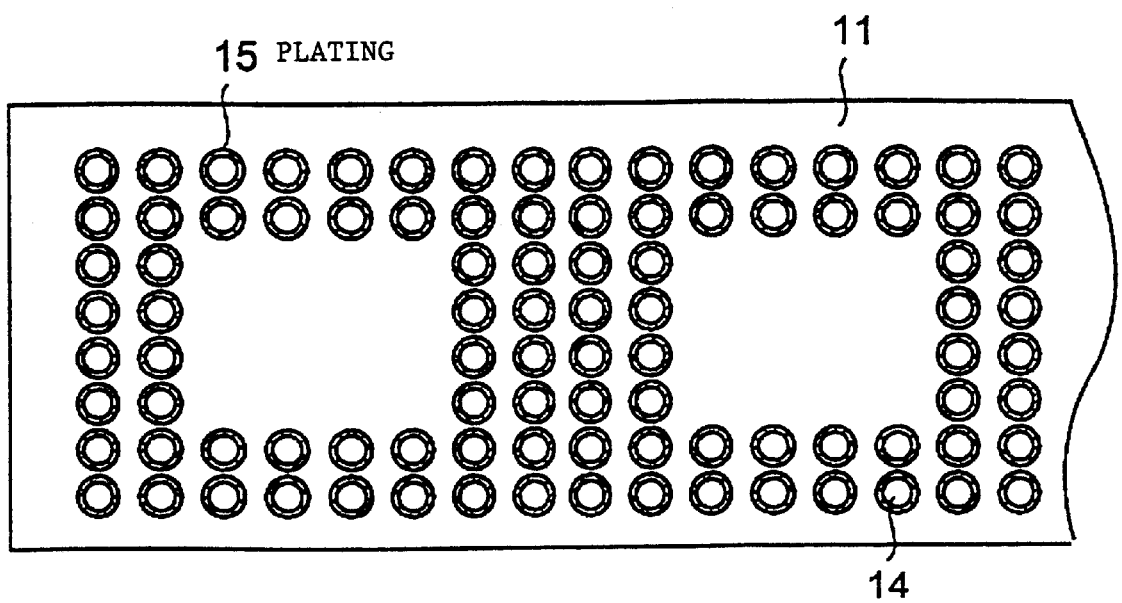
FIG. 6 is a plan view showing a state where the insulation tape is plated.
Figure 7:
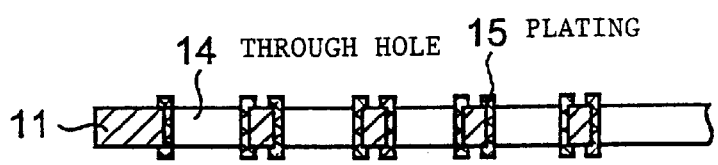
FIG. 7 is an enlarged cross section of a part of the plated insulation tape.

FIGS. 5 to 7 are diagrams for explaining a manufacturing method of the semiconductor chip mounting tape shown in FIGS. 2 to 4. FIG. 5 is a plan view showing an insulation tape in which through holes are formed. FIG. 6 is a plan view showing a plated insulation tape. FIG. 7 is an enlarged cross sectional view of a part of the plated insulation tape.

In FIG. 5, the circular through holes 14 slightly smaller than the diameter of the solder balls are formed in the prepared insulation tape 11 in accordance with a predetermined layout pattern of the external connecting terminals.

In FIGS. 6 and 7, the plating 15 is performed to the opening portions of the through holes 14. Specifically, the wall portions of the through holes 14 and hole peripheral portions on both sides of the insulation tape 11 is performed by electrolyte-free plating or the like.

Subsequently, flux is deposited onto the second surface of the insulation tape 11, for example, the lower surface of FIG. 7 by dipping. The method of depositing the flux is not limited to the dipping method but the flux can be also deposited by any of such methods as transferring and coating.

The second surface of the insulation tape 11 on which the flux is deposited is set so as to face upward and the solder balls 16 are mounted to the through holes 14 by a ball mounter as shown in FIG. 4.

By allowing the tape to pass through a reflow furnace, the solder balls 16 are reflowed, thereby fixedly bonding the solder balls 16 onto the insulation tape 11 through the plating 15 as shown in FIG. 4.

The external connecting terminals 12 are, consequently, formed to the second surface of the insulation tape 11 and, at the same time, a part of each of the solder balls 16 is exposed to the first surface of the insulation tape 11 via the through hole 14 as shown in FIG. 4, thereby forming the post portion 13.

In the manufacturing method of the semiconductor chip installing tape according to the invention as mentioned above, since the flux is not directly transferred to the solder balls 16, no flux is deposited to the vacuum plate and the solder balls 16 can be positively mounted to the insulation tape 11.

Since the flux is sufficiently deposited to the plated portions of the insulation tape 11 by dipping or the like, the solder balls 16 do not drop due to the non-fused state of the soldering.

Further, since the external connecting terminal 12 and post portion 13 are simultaneously formed from the same solder ball 16, the manufacturing time can be shortened. Differing from the conventional substrate, it is possible to omit the copper foil sticking step for the circuit pattern, the wiring step of wiring the post portions and external terminals of the substrate, the soldering resist coating step of protecting the circuit pattern, and the like.

Figure 8:
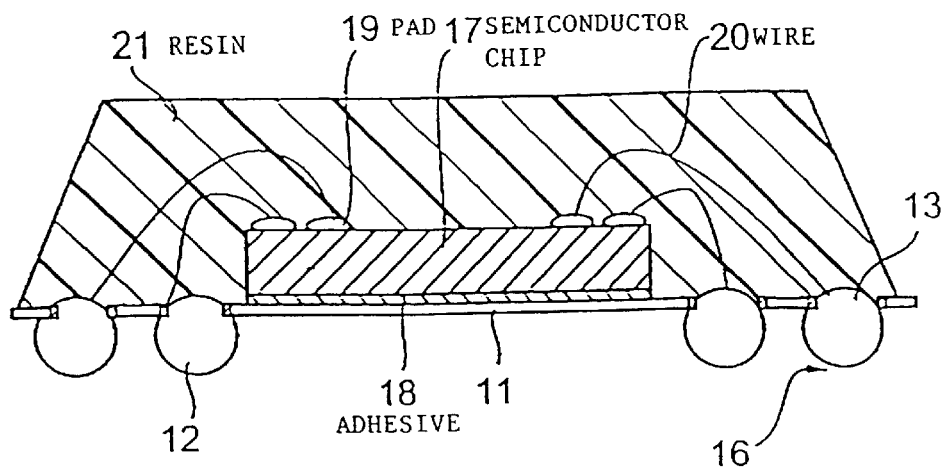
FIG. 8 is a cross sectional view showing a semiconductor device according to the invention.
Figure 1:
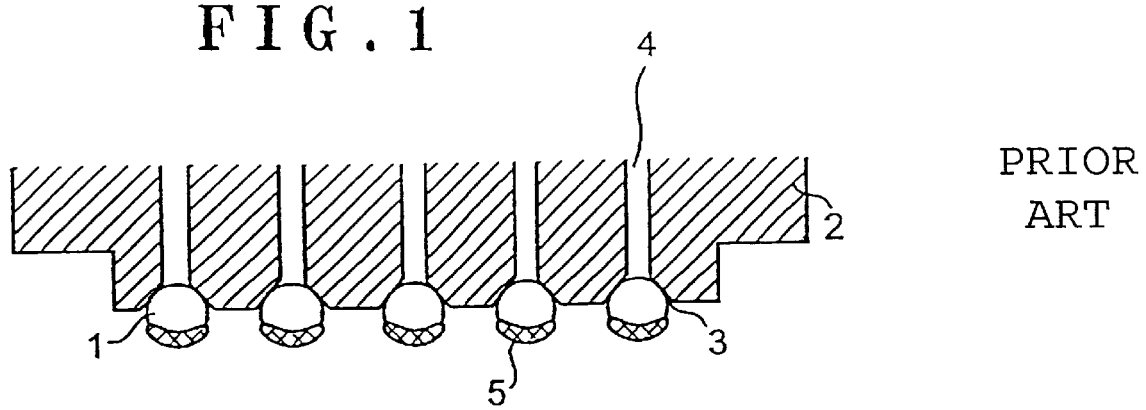
FIG. 1 is a cross sectional view showing solder balls held by vacuum in a conventional arrangement.

FIG. 8 is a cross sectional view showing a semiconductor device according to the invention and shows a BGA package using a semiconductor chip mounting tape with external connecting terminals according to the invention.

A semiconductor chip 17 is mounted on the surface of a semiconductor chip mounting tape in which the post portions 13 are formed on the first surface of the insulation tape 11 by solder balls 16 and the external connecting terminals 12 are formed on the second surface by the same solder balls 16. The semiconductor chip 17 is fixed with an adhesive 18.

Pads 19 formed on the semiconductor chip 17 and the post portions 13 are wire-bonded by bonding wires 20 such as gold wires or the like respectively, thereby resin-sealing the wire-bonded portions and the semiconductor chip 17 by a resin 21. The wire-bonded portions of the post portions 13 and a joint interface between the semiconductor chip 17 and insulation tape 11 are, therefore, protected by the resin-sealing.

Although the semiconductor device of the BGA package is attached onto an installing substrate (not shown) by reflowing the solder balls 16, in this instance, even if the solder is fused, since the wire-bonded portions are resin-sealed, there is no fear such that the wires 20 are peeled off from the post portions 13.

As mentioned above, in the second embodiment according to the invention, the BGA package with the external connecting terminals in which the diameter of the solder balls is small and a pitch is narrow can be realized by using the semiconductor chip mounting tape according to the invention.

Since the semiconductor chip mounting tape is thinner than that of the conventional substrate, a package which is thinner by an amount corresponding to the thin tape can be formed.

Subsequently, a manufacturing method of the semiconductor device according to the invention will now be described. First, the semiconductor chip mounting tape according to the invention is prepared. The semiconductor chip mounting tape is constructed so as to have a length such that a plurality of semiconductor chips can be installed simultaneously.

As shown in FIG. 8, the first surface of the insulation tape 11 formed with the post portions 13 is set so as to face upward, and the semiconductor chip 17 is die-bonded at a predetermined position on the first surface. The semiconductor chip 17 is fixed onto the insulation tape 11 by the adhesive 18.

Subsequently, the pads 19 formed on the semiconductor chip 17 and the post portions 13 are electrically connected by the wire-bonding method by using the wires 20.

After that, the wire-bonded portions and the semiconductor chip 17 are resin-sealed with the resin 21.

Since the manufacturing process is executed on the semiconductor chip mounting tape and a plurality of semiconductor devices are manufactured, the semiconductor chip mounting tape is cut and the BGA package is segmented, thereby completing the manufacturing method.

According to the method of fabricating the semiconductor device of the invention as mentioned above, since the manufacturing step of the semiconductor chip mounting tape is remarkably shortened, the manufacturing time of the semiconductor device can be also reduced.

According to the invention as mentioned above, since the post portions and external connecting terminals which are connected to the semiconductor chip via the through holes formed in the insulation tape are integrally formed, the external connecting terminals can be certainly formed to the insulation tape.

What is claimed is:

1. A semiconductor chip mounting tape on which external connecting terminals are formed in accordance with a layout pattern, comprising;

an insulating tape having through holes and comprised of an insulating material free of conductor patterns on its first and second surfaces;

post portions that are to be connected to a semiconductor chip via wires, said post portions being formed on the first surface of said insulation tape, with each of the post portions being directly connected to a respective wire for direct connection to an electrode of a semiconductor chip on said first surface of the tape; and external connecting terminals formed on the second surface of said insulation tape; and, wherein:

said post portions and said external connecting terminals are integrally formed via said through holes of said insulation tape and are connected to the tape at the through holes, and said through holes are closed respectively by said post portions and external connecting terminals which are formed integrally.

2. A semiconductor device comprising:

an insulating tape that has a first surface and a second surface on opposite sides of the insulating tape, with said insulating tape having a plurality of through holes that extend between the first surface and the second surface, and with said tape being comprised of an insulating material free of conductor patterns on its first and second surfaces;

a plurality of ball electrodes arranged on the first surface of the insulating tape, with a part of each of the ball electrodes being embedded in the through hole and fastened to the insulating tape;

a semiconductor chip mounted on the second surface of the insulating tape, said semiconductor chip having a plurality of electrodes thereon;

a plurality of wires directly connecting the respective electrodes on the semiconductor chip to embedded parts of the ball electrodes; and a sealing resin that seals the semiconductor chip and the wires.

3. A semiconductor device according to claim 2, wherein said insulating tape has a plurality of portions for mounting a plurality of semiconductor chips, and said insulating tape is to be segmented to produce a plurality of semiconductor device packages.

4. A method for fabricating a semiconductor chip mounting tape comprising the steps of:

providing an insulating tape that has a first surface and a second surface on opposite sides of the insulating tape, that has a plurality of through holes that extend between the first surface and the second surface, and that is free of conductive patterns on its first and second surfaces;

forming a plurality of ball electrodes on the first surface of the insulating tape, with a part of each of the ball electrodes being embedded in the through hole and connected to the insulation tape;

mounting a semiconductor chip on the second surface of the insulating tape;

connecting the semiconductor chip to the ball electrode by wires by connecting one end of a respective wire to a respective ball electrode and another end of the wire to an electrode on the semiconductor chip to directly connect the ball electrode to the semiconductor chip; and sealing the semiconductor chip and the wires by a sealing resin.

5. A method for fabricating a semiconductor device as claimed in claim 4, wherein a plurality of semiconductor chips are mounted on said insulating tape by die-bonding, and further including segmenting said insulating tape to produce a plurality of semiconductor device packages.

* * * * *